(12) United States Patent
Yoon et al.

(10) Patent No.: US 12,225,747 B2
(45) Date of Patent: Feb. 11, 2025

(54) QUANTUM DOT DEVICE AND ELECTRONIC DEVICE

(71) Applicant: SAMSUNG ELECTRONICS CO., LTD., Suwon-si (KR)

(72) Inventors: Won Sik Yoon, Suwon-si (KR); Ju Hyun Kim, Suwon-si (KR); Ha Il Kwon, Suwon-si (KR); Kwang Hee Kim, Suwon-si (KR); Taehyung Kim, Suwon-si (KR); Su Jin Park, Suwon-si (KR); Dae Young Chung, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 18/512,352

(22) Filed: Nov. 17, 2023

(65) Prior Publication Data

US 2024/0224564 A1  Jul. 4, 2024

(30) Foreign Application Priority Data

Dec. 27, 2022 (KR) .................. 10-2022-0186133

(51) Int. Cl.
*H01L 51/50* (2006.01)
*H10K 50/115* (2023.01)
(Continued)

(52) U.S. Cl.
CPC ......... *H10K 50/115* (2023.02); *H10K 50/156* (2023.02); *H10K 50/16* (2023.02)

(58) Field of Classification Search
CPC .... H10K 50/115; H10K 50/156; H10K 50/16; H10K 71/00; H10K 71/12; H10K 85/342;
(Continued)

(56) References Cited

U.S. PATENT DOCUMENTS

| 10,446,781 B2 | 10/2019 | Seo et al. |
| 2021/0159418 A1 | 5/2021 | Ye et al. |
| 2022/0131108 A1 | 4/2022 | Park et al. |

FOREIGN PATENT DOCUMENTS

| CN | 105895816 B | 6/2018 |
| CN | 114695736 A | 7/2022 |

(Continued)

OTHER PUBLICATIONS

Kim et al. ("Performance Improvement of Quantum Dot-Light-Emitting Diodes Enabled by an Alloyed ZnMgO Nanoparticle Electron Transport Layer"), Chemestry of Material, US, (Dec. 18, 2014), vol. 27, No. 1, pp. 197-204. (Year: 2014).*

(Continued)

*Primary Examiner* — Elmito Breval
(74) *Attorney, Agent, or Firm* — CANTOR COLBURN LLP

(57) ABSTRACT

A quantum dot device including an anode and a cathode, a light emitting layer disposed between the anode and the cathode, the light emitting layer comprising quantum dots, a first hole auxiliary layer disposed on the anode, the first hole auxiliary layer including poly(3,4-ethylenedioxythiophene)-polystyrenesulfonate or a derivative thereof (PEDOT:PSS), a second hole auxiliary layer disposed on the first hole auxiliary layer and including a hole transport material different from the PEDOT:PSS, wherein the light emitting layer is disposed on the second hole auxiliary layer, wherein the first hole auxiliary layer has a first surface facing the anode and a second surface facing the second hole auxiliary layer, and the second surface includes a surface modification region including a surface modification material having a carboxylic acid group, a phosphonic acid group, a sulfonic acid group, or a salt thereof. An electronic device that includes the quantum dot device.

20 Claims, 1 Drawing Sheet

(51) Int. Cl.
*H10K 50/15* (2023.01)
*H10K 50/16* (2023.01)

(58) Field of Classification Search
CPC ......... H10K 2101/10; H10K 2102/351; H10K 71/40; C09K 2211/185
See application file for complete search history.

(56) References Cited

FOREIGN PATENT DOCUMENTS

| KR | 20210064485 A | 6/2021 |
| KR | 20220054498 A | 5/2022 |
| KR | 102428232 B1 | 8/2022 |
| KR | 20220133475 A | 10/2022 |
| WO | 2020174594 A1 | 9/2020 |
| WO | 2022157879 A1 | 7/2022 |

OTHER PUBLICATIONS

2014.*

* cited by examiner

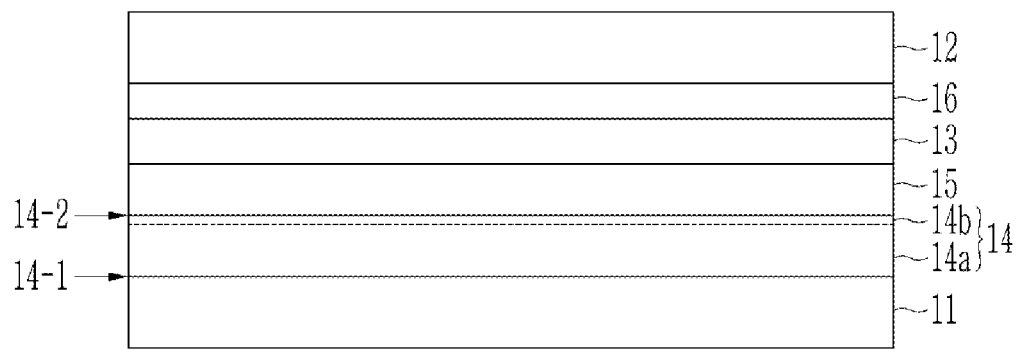

QUANTUM DOT DEVICE AND ELECTRONIC DEVICE

CROSS-REFERENCE TO RELATED APPLICATION

This application claims priority to Korean Patent Application No. 10-2022-0186133 filed in the Korean Intellectual Property Office on Dec. 27, 2022, and all the benefits accruing therefrom under 35 U.S.C. § 119, the entire content of which is incorporated herein by reference.

BACKGROUND

1. Field

The present disclosure relates to a quantum dot device, a light emitting display device, and an electronic device including the quantum dot device.

2. Description of the Related Art

A semiconductor particle having a nanoscale size (e.g., a semiconductor nanocrystal particle) may exhibit luminescence. For example, a quantum dot including a semiconductor nanocrystal may exhibit a quantum confinement effect. Light emission from the semiconductor nanoparticle may result when electrons in an excited state transit from a conduction band to a valence band by, for example, light excitation or voltage application. A semiconductor nanoparticle may be controlled to emit light in a desired wavelength region by controlling their size and/or composition. Accordingly, a quantum dot may be used as a light emitting element configured to emit light of a particular wavelength.

SUMMARY

The application of a quantum dot as a light emitting element is of recent interest and significant research is directed to improving the performance of a quantum dot device, e.g., a display device.

An embodiment provides a quantum dot device capable of realizing improved performance as a light emitting element.

An embodiment provides an electronic device, e.g., a display device, including the quantum dot device.

According to an embodiment, a quantum dot device includes an anode and a cathode, a light emitting layer disposed between the anode and the cathode, the light emitting layer comprising quantum dots, a first hole auxiliary layer disposed between the anode and the light emitting layer, the first hole auxiliary layer including poly(3,4-ethylenedioxythiophene)polystyrenesulfonate or a derivative thereof (PEDOT:PSS), a second hole auxiliary layer disposed between the first hole auxiliary layer and the light emitting layer, the second hole auxiliary layer including a hole transport material different from the PEDOT:PSS, wherein the first hole auxiliary layer has a first surface facing the anode and a second surface facing the second hole auxiliary layer, and the second surface of the first hole auxiliary layer includes a surface modification region including a surface modification material having a carboxylic acid group, a phosphonic acid group, a sulfonic acid group, or a salt thereof.

A HOMO energy level of the surface modification material may be deeper than a HOMO energy level of the PEDOT:PSS and shallower than a HOMO energy level of the hole transport material.

The HOMO energy level of the surface modification material may be about 5.20 eV to about 5.60 eV.

The surface modification material may be represented by Chemical Formula 1.

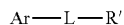

Chemical Formula 1

In Chemical Formula 1,
Ar is a substituted or unsubstituted C6 to C20 aryl group, a substituted or unsubstituted C3 to C20 heteroaryl group, or any combination thereof,
L is a single bond, a substituted or unsubstituted C1 to C20 alkylene group, a substituted or unsubstituted C6 to C20 arylene group, a substituted or unsubstituted C3 to C20 heteroarylene group, or any combination thereof, and
R' is a carboxylic acid group, a phosphonic acid group, a sulfonic acid group, or a respective salt of each thereof.
Ar may be a substituted or unsubstituted phenyl group, a substituted or unsubstituted naphthyl group, a substituted or unsubstituted anthracenyl group, a substituted or unsubstituted fluorenyl group, a substituted or unsubstituted carbazolyl group, a substituted or unsubstituted dibenzofuranyl group, a substituted or unsubstituted dibenzothiophenyl group, or any combination thereof.

A thickness of the surface modification region may be about 1% to about 30% of a total thickness of the first hole auxiliary layer.

A thickness of the surface modification region may be greater than or equal to about 1 nanometer (nm) and less than about 10 nm.

The quantum dot device may further include an electron auxiliary layer between the light emitting layer and the cathode, and the electron auxiliary layer may include n-type inorganic nanoparticles represented by $Zn_{1-x}Q_xO$, wherein Q is one or more metals except Zn and $0 \le x < 0.5$, or a mixture of the n-type inorganic nanoparticles and an alkali metal, an alkali metal compound, or any combination thereof.

According to some example embodiments, a quantum dot device includes an anode and a cathode, a light emitting layer disposed between the anode and the cathode, the light emitting layer including quantum dots, and a first hole auxiliary layer between the anode and the light emitting layer, wherein the first hole auxiliary layer includes poly(3,4-ethylenedioxythiophene)polystyrenesulfonate (PEDOT:PSS) or a derivative thereof, and a surface modification material having a carboxylic acid group, a phosphonic acid group, a sulfonic acid group, or a salt thereof.

The surface modification material present in the first hole auxiliary layer may comprise a volume or weight amount of surface modification material that is less than a volume or weight amount of PEDOT:PSS, respectively.

The surface modification material may be present at the surface of the first hole auxiliary layer, e.g., proximate to the light emitting layer.

A HOMO energy level of the surface of the first hole auxiliary layer may be deeper than a HOMO energy level of the PEDOT:PSS.

The first hole auxiliary layer may include a hole auxiliary region proximate to the anode and including the PEDOT:PSS, and a surface modification region proximate to the light emitting layer and including the surface modification material.

A thickness of the surface modification region may be about 1% to about 30% of a total thickness of the first hole auxiliary layer.

A thickness of the surface modification region may greater than or equal to about 1 nm and less than about 10 nm.

The surface modification material may be represented by Chemical Formula 1.

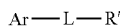

Chemical Formula 1

In Chemical Formula 1,

Ar is a substituted or unsubstituted C6 to C20 aryl group, a substituted or unsubstituted C3 to C20 heteroaryl group, or any combination thereof, L is a single bond, a substituted or unsubstituted C1 to C20 alkylene group, a substituted or unsubstituted C6 to C20 arylene group, a substituted or unsubstituted C3 to C20 heteroarylene group, or any combination thereof, and R' is a carboxylic acid group, a phosphonic acid group, a sulfonic acid group, or a respective salt of each thereof.

Ar may be a substituted or unsubstituted phenyl group, a substituted or unsubstituted naphthyl group, a substituted or unsubstituted anthracenyl group, a substituted or unsubstituted fluorenyl group, a substituted or unsubstituted carbazolyl group, a substituted or unsubstituted dibenzofuranyl group, a substituted or unsubstituted dibenzothiophenyl group, or any combination thereof.

The quantum dot device may further include a second hole auxiliary layer disposed between the first hole auxiliary layer and the light emitting layer and including a hole transport material different from PEDOT:PSS, a HOMO energy level of the surface modification material may be deeper than a HOMO energy level of the PEDOT:PSS and shallower than a HOMO energy level of the hole transport material, and a HOMO energy level of the quantum dots may be deeper than a HOMO energy level of the hole transport material.

The quantum dot device may further include an electron auxiliary layer between the light emitting layer and the cathode, and the electron auxiliary layer may include n-type inorganic nanoparticles represented by $Zn_{1-x}Q_xO$, wherein Q is one or more metals except Zn and $0 \le x < 0.5$, or a mixture of the n-type inorganic nanoparticles and an alkali metal, an alkali metal compound, or any combination thereof.

According to another embodiment, an electronic device including the quantum dot device is provided.

BRIEF DESCRIPTION OF A DRAWING

A schematic cross-sectional view of a quantum dot device according to an embodiment.

DETAILED DESCRIPTION

Hereinafter, example embodiments of the present disclosure will be described in detail so that a person skilled in the art would understand the same. This disclosure may, however, be embodied in many different forms and is not construed as limited to the example embodiments set forth herein.

In order to clearly explain the present disclosure, parts irrelevant to the description are omitted. In the drawing, the thickness of layers, films, regions, etc., are exaggerated for clarity. Like reference numerals designate like elements throughout the specification. The size and thickness of each constituent element as shown in the drawing is randomly indicated for better understanding and ease of description, and this disclosure is not necessarily limited to as shown.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Also, to be disposed "on" the reference portion means to be disposed above or below the reference portion and does not necessarily mean "above" in an opposite direction of gravity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. Therefore, the term "nanoparticle" such as a semiconductor or zinc oxide nanoparticle or a quantum dot may mean a single nanoparticle or quantum dot or a plurality of nanoparticles or quantum dots. "At least one" is not to be construed as limiting "a" or "an." As used herein, "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, elements, and/or components, but do not preclude the presence or addition of one or more other features, regions, integers, steps, elements, components, and/or groups thereof. Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, when specific definition is not otherwise provided, an energy level refers to the highest occupied molecular orbital (HOMO) energy level or the lowest unoccupied molecular orbital (LUMO) energy level.

Hereinafter, a work function, a HOMO energy level, or a LUMO energy level is expressed as an absolute value from a vacuum level. In addition, if the work function, HOMO energy level, or LUMO energy level is referred to be deep, high, or large work function or energy level means that the absolute value is large with the vacuum level set to "0 eV".

If the work function, HOMO energy level, or LUMO energy level is referred to be shallow, low, or small, means that the absolute value is small with the vacuum level set to "0 eV".

The HOMO energy level and work function may be measured by ultraviolet photoelectron spectroscopy (UPS), and the LUMO energy level may be calculated from the energy bandgap obtained at the absorption peak and the HOMO energy level.

As used herein, "metal" includes a metal and a semimetal.

As used herein, the expression "not including cadmium (or other harmful heavy metal)" refers to the case where a concentration of the cadmium (or the harmful heavy metal) may be less than or equal to about 100 ppm, less than or equal to about 50 ppm, less than or equal to about 10 ppm, or almost zero. In some example embodiments, substantially no amount of the cadmium (or other heavy metal) may be present or, if present, an amount of the cadmium (or other heavy metal) may be less than or equal to a detection limit or as an impurity level of a given analysis tool.

As used herein, "substantially" or "approximately" or "about" means not only the stated value, but also the mean within an acceptable range of deviations, considering the errors associated with the corresponding measurement and the measurement of the measured value. For example, "substantially" or "approximately" can mean within +10% or +5% or within standard deviation of the stated value.

As used herein, "PEDOT:PSS or a derivative thereof" refers to poly(3,4-ethylenedioxythiophene)polystyrenesulfonate as well as a structural or a chemical group modification of the polymer poly(3,4-ethylenedioxythiophene)-polystyrenesulfonate, for example, including one or more group substituents (as defined herein) on the ethylene, thiophene, or styrene moieties of the polymer, a doping of the poly(3,4-ethylenedioxythiophene)polystyrenesulfonate with another material element, compound, material, or polymer, or a grafting of a second polymer to the poly(3,4-ethylenedioxythiophene)polystyrenesulfonate.

As used herein, "alkyl" refers to a linear or branched saturated monovalent hydrocarbon group (methyl, ethyl hexyl, etc.). In an embodiment, an alkyl group has from 1 to 50 carbon atoms, or 1 to 18 carbon atoms, or 1 to 12 carbon atoms.

As used herein, "alkenyl" refers to a linear or branched monovalent hydrocarbon group having one or more carbon-carbon double bond. In an embodiment, an alkenyl group may have from 2 to 50 carbon atoms, or 2 to 18 carbon atoms, or 2 to 12 carbon atoms.

As used herein, "alkynyl" refers to a linear or branched monovalent hydrocarbon group having one or more carbon-carbon triple bond. In an embodiment, an alkynyl group may have from 2 to 50 carbon atoms, or 2 to 18 carbon atoms, or 2 to 12 carbon atoms.

As used herein, the term "alkylene" indicates a straight or branched saturated aliphatic hydrocarbon group having a valence of at least two, optionally substituted with one or more substituents where indicated, provided that the valence of the alkylene group is not exceeded.

As used herein, "hetero" refers to one including 1 to 5 heteroatoms of N, O, S, Si, P, Se, Te, or a combination thereof.

As used herein, "C6 to C30 aryl group", refers to an aromatic hydrocarbon group containing at least one aromatic ring including a fused aromatic ring system as well as two or more aryl rings joined by a single bond. Non-limiting examples are phenyl, biphenyl, naphthyl, anthracenyl, or fluorenyl.

As used herein, "C2 to C30 heteroaryl group", refers to an aromatic group containing at least one aromatic ring with 1 to 3 heteroatoms. Non-limiting examples are pyridyl, quinolyl, carbazolyl, dibenzofuranyl group, or dibenzothiophenyl group, As used herein, the term "arylene" indicates an aryl group having a valence of at least two, optionally substituted with one or more substituents where indicated, provided that the valence of the arylene group is not exceeded. Likewise, the term "heteroarylene" indicates a heteroaryl group having a valence of at least two, optionally substituted with one or more substituents where indicated, provided that the valence of the arylene group is not exceeded.

As used herein, when a definition is not otherwise provided, 'substituted' refers to a replacement of at least one hydrogen of a compound or the corresponding moiety by a substituent selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroaryl group, a C3 to C30 cycloalkyl group, a C3 to C15 cycloalkenyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation).

Hereinafter, a quantum dot device according to some example embodiments is described with reference to the drawing.

The quantum dot device according to an embodiment may be a quantum dot electroluminescent device that emits light from the quantum dot by applying an electric field to electrodes.

A schematic cross-sectional view (drawing) illustrating a quantum dot device according to an exemplary embodiment is provided.

Referring to the drawing a quantum dot device 10 according to an exemplary embodiment includes a first electrode 11 and a second electrode 12 spaced apart and facing each other; a light emitting layer 13 between the first electrode 11 and the second electrode 12; a first hole auxiliary layer 14 and a second hole auxiliary layer 15 between the first electrode 11 and the light emitting layer 13; and an electron auxiliary layer 16 between the second electrode 12 and the light emitting layer 13.

The substrate (not shown) may be disposed at an opposite surface of the first electrode 11 or may be disposed on the second electrode 12. The substrate may be for example made of an inorganic material such as glass; an organic material such as polycarbonate, polymethylmethacrylate, polyethyleneterephthalate, polyethylenenaphthalate, polyamide, polyethersulfone, or any combination thereof; or a silicon wafer. The substrate may be omitted.

One of the first electrode 11 and the second electrode 12 is an anode and the other is a cathode. For example, the first electrode 11 may be an anode and the second electrode 12 may be a cathode.

The first electrode 11 may be made of a conductor having a relatively high work function, for example, a metal, a conductive metal oxide, or any combination thereof. The first electrode 11 may be made of, for example, a metal or an alloy thereof such as nickel, platinum, vanadium, chromium, copper, zinc, or gold; a conductive metal oxide such as zinc oxide, indium oxide, tin oxide, indium tin oxide (ITO), indium zinc oxide (IZO), or a fluorine-doped tin oxide; or a combination of metal and oxide such as ZnO and Al or $SnO_2$ and Sb, but is not limited thereto.

The second electrode 12 may be made of a conductor having a lower work function than the first electrode 11, and may be made of, for example, a metal, a conductive metal oxide, and/or a conductive polymer. The second electrode 12 may include, for example, a metal such as aluminum, magnesium, calcium, sodium, potassium, titanium, indium, yttrium, lithium, gadolinium, silver, tin, lead, cesium, barium, or an alloy thereof; and a multilayer structure material such as LiF/Al, $Li_2O$/Al, Liq/Al, LiF/Ca, and $BaF_2$/Ca, but is not limited thereto.

A work function of the first electrode 11 may be higher than a work function of the second electrode 12, for example the work function of the first electrode 11 may be, for example, about 4.5 eV to about 5.0 eV and the work function of the second electrode 12 may be about 4.0 eV to about 4.7 eV. Within the above range, the work function of the first electrode 11 may be, for example, about 4.6 eV to about 4.9 eV, and the work function of the second electrode 12 may be, for example, about 4.0 eV to about 4.5 eV.

At least one of the first electrode 11 and the second electrode 12 may be a light-transmitting electrode and the light-transmitting electrode may be, for example, made of a conductive oxide such as a zinc oxide, indium oxide, tin oxide, indium tin oxide (ITO), indium zinc oxide (IZO), or fluorine doped tin oxide, or a metal thin layer of a single layer or a multilayer. Any one of the first electrode 11 and the second electrode 12 may be an opaque electrode, and the opaque electrode may be made of, for example, an opaque conductor such as aluminum (Al), silver (Ag), or gold (Au).

The light emitting layer 13 includes a quantum dot (quantum dots, hereinafter referred to as quantum dot) as a light emitting body that emits light by an electric field. The quantum dot means a semiconductor nanocrystal in a broad sense and may exhibit a quantum confinement effect. Herein, the quantum dot may have any shape, and is not particularly limited. In one non-limiting example, the quantum dot may have various shapes, such as an isotropic semiconductor nanocrystal, a quantum rod, and/or a quantum plate. Herein, the quantum rod may mean a quantum dot having an aspect ratio greater than about 1, for example, an aspect ratio of greater than or equal to about 2, greater than or equal to about 3, or greater than or equal to about 5. For example, an aspect ratio of the quantum rod may be less than or equal to about 50, less than or equal to about 30, or less than or equal to about 20.

The quantum dot may have, for example a particle diameter (an average largest particle diameter for a non-spherical shape) of about 1 nm to about 100 nm, for example, about 1 nm to about 80 nm, for example, about 1 nm to about 50 nm, or for example, about 1 nm to about 20 nm. In an example, the (average) size of the quantum dot(s) may be greater than or equal to about 1 nm, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, or greater than or equal to about 12 nm. In an example, the (average) size of the quantum dot(s) may be less than or equal to about 50 nm, less than or equal to about 40 nm, less than or equal to about 30 nm, less than or equal to about 25 nm, less than or equal to about 20 nm, less than or equal to about 19 nm, less than or equal to about 18 nm, less than or equal to about 17 nm, less than or equal to about 16 nm, or less than or equal to about 15 nm. For example, the average size of quantum dot (e.g., emitting blue light) may be for example less than or equal to about 4.5 nm, for example, less than or equal to about 4.3 nm, less than or equal to about 4.2 nm, less than or equal to about 4.1 nm, or less than or equal to about 4.0 nm. In an example, the (average) size of the quantum dot may be about 2.0 nm to about 4.5 nm, about 2.0 nm to about 4.3 nm, about 2.0 nm to about 4.2 nm, about 2.0 nm to about 4.1 nm, or about 2.0 nm to about 4.0 nm.

Energy bandgaps of quantum dots may be controlled according to sizes and compositions of the quantum dots, and thus emission wavelength may be controlled. For example, as the size of a quantum dot increases, the quantum dot may have a relatively narrow (or smaller) energy bandgap, and thus, emit light in a relatively long wavelength region. As the size of the quantum dot decreases, the quantum dot may have relatively wide (or larger) energy bandgap, and thus, emit light in a relatively short wavelength region.

For example, the quantum dot (or a light emitting layer or a device including the same) may be configured to emit, for example, light in a predetermined wavelength region of a visible light region according to its size and/or composition. For example, the quantum dot may be configured to emit blue light, red light, or green light, and the blue light may have, for example, a peak emission wavelength in a range from about 430 nm to about 480 nm, the red light may have, for example, a peak emission wavelength in a range from about 600 nm to about 670 nm, and the green light may have, for example, a peak emission wavelength in a range from about 520 nm to about 560 nm.

In the quantum dot device 10 of an embodiment, a maximum emission wavelength (also referred to as peak emission wavelength) of the light emitting layer 13 may be greater than or equal to about 300 nm, greater than or equal to about 400 nm, greater than or equal to about 430 nm, greater than or equal to about 450 nm, for example, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum emission wavelength of the quantum dot may be in the range of less than or equal to about 800 nm, less than or equal to about 780 nm, less than or equal to about 750 nm, for example, less than or equal to about 700 nm, less than or equal to about 670 nm, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum emission wavelength of the quantum dots may be in the range of about 430 nm to about 670 nm.

In the quantum dot device 10 of an embodiment, the light emitting layer 13 or quantum dot(s) may be configured to emit green light, and the maximum emission wavelength thereof may be in the range of greater than or equal to about 500 nm (e.g., greater than or equal to about 510 nm or greater than or equal to about 520 nm) and less than or equal to about 560 nm (e.g., less than or equal to about 550 nm or less than or equal to about 540 nm). In the quantum dot device 10 of an example, the light emitting layer 13 or quantum dot(s) may be configured to emit red light and the maximum emission wavelength thereof may be in the range of greater than or equal to about 600 nm (e.g., may be greater than or equal to about 610 nm) and less than or equal to about 670 nm (e.g., less than or equal to about 650 nm or less than or equal to about 640 nm). In the quantum dot device 10 of an example, the light emitting layer 13 or quantum dot(s) may be configured to emit blue light and the maximum emission wavelength thereof may be in the range of greater than or equal to about 430 nm (e.g., greater than or equal to about 440 nm or greater than or equal to about 450 nm) and less than or equal to about 480 nm (e.g., less than or equal to about 470 nm or less than or equal to about 465 nm).

The quantum dot (or a light emitting layer or a device including the same) may have, for example, a quantum yield of greater than or equal to about 10%, for example, greater than or equal to about 20%, greater than or equal to about 30%, greater than or equal to about 50%, greater than or equal to about 60%, greater than or equal to about 70% or greater than or equal to about 90%.

The emission spectrum of the quantum dot may have a relatively narrow full width at half maximum (FWHM). Herein, the FWHM is a width of a wavelength corresponding to half of the maximum emission point in the emission spectrum. By applying the quantum dot having an emission spectrum of a relatively narrow FWHM and the light emitting layer 13 including the same to the quantum dot device 10, high color purity (or color reproducibility) may be realized.

The FWHM of the quantum dot (or light emitting layer 13) may be, for example, less than or equal to about 60 nm, within the above range, for example, less than or equal to about 55 nm, less than or equal to about 52 nm, less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm. For example, the FWHM of the quantum dot (or light emitting layer 13) may be about 2 nm to about 60 nm, about 2 nm to about 55 nm, about 2 nm to about 50 nm, about 2 nm to about 49 nm, about 2 nm to about 48 nm, about 2 nm to about 47 nm, about 2 nm to about 46 nm, about 2 nm to about 45 nm, about 2 nm to about 44 nm, about 2 nm to about 43 nm, about 2 nm to about 42 nm, about 2 nm to about 41 nm, about 2 nm to about 40 nm, about 2 nm to about 39 nm, about 2 nm to about 38 nm, about 2 nm to about 37 nm, about 2 nm to about 36 nm, about 2 nm to about 35 nm, about 2 nm to about 34 nm, about 2 nm to about 33 nm, about 2 nm to about 32 nm, about 2 nm to about 31 nm, about 2 nm to about 30 nm, about 2 nm to about 29 nm, or about 2 nm to about 28 nm. For example, the quantum dot may include a Group II-VI semiconductor compound, a Group III-V semiconductor compound, a Group IV-VI semiconductor compound, a Group IV semiconductor, a Group I-III-VI semiconductor compound, a Group I-II-IV-VI semiconductor compound, a Group II-III-V semiconductor compound, or any combination thereof.

The Group II-VI semiconductor compound may be for example selected from a binary element compound selected from CdSe, CdTe, ZnS, ZnSe, ZnTe, ZnO, HgS, HgSe, HgTe, MgSe, MgS, and a combination thereof; a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof, but is not limited thereto.

The Group III-V semiconductor compound may be for example selected from a binary element compound selected from GaN, GaP, GaAs, GaSb, AlN, AlP, AlAs, AlSb, InN, InP, InAs, InSb, and a combination thereof; a ternary element compound selected from GaNP, GaNAs, GaNSb, GaPAs, GaPSb, AlNP, AlNAs, AlNSb, AlPAS, AlPSb, InNP, InNAs, InNSb, InPAs, InPSb, GaAlNP, and a combination thereof; and a quaternary element compound selected from GaAlNAs, GaAlNSb, GaAlPAs, GaAlPSb, GaInNP, GaIn-NAs, GaInNSb, GaInPAs, GaInPSb, InAlNP, InAlNAs, InAlNSb, InAlPAs, InAlPSb, and a combination thereof, but is not limited thereto. The Group IV-VI semiconductor compound may be for example selected from a binary element compound selected from SnS, SnSe, SnTe, PbS, PbSe, PbTe, and a combination thereof; a ternary element compound selected from SnSeS, SnSeTe, SnSTe, PbSeS, PbSeTe, PbSTe, SnPbS, SnPbSe, SnPbTe, and a combination thereof; and a quaternary element compound selected from SnPbSSe, SnPbSeTe, SnPbSTe, and a combination thereof, but is not limited thereto. The Group IV semiconductor may be for example selected from a singular element semiconductor selected from Si, Ge, and a combination thereof; and a binary element semiconductor compound selected from SiC, SiGe, and a combination thereof, but is not limited thereto.

The Group I-III-VI semiconductor compound may be for example selected from a ternary element compound selected from AgInS, $AgInS_2$, $AgInSe_2$, AgGaS, $AgGaS_2$, $AgGaSe_2$, CuInS, $CuInS_2$, $CuInSe_2$, $CuGaS_2$, $CuGaSe_2$, $CuGaO_2$, $AgGaO_2$, and $AgAlO_2$; a quaternary element compound selected from $AgInGaS_2$, $AgInGaSe_2$, CuInGaSe, and CuInGaS; or any combination thereof, but is not limited thereto.

The Group I-II-IV-VI semiconductor compound may be for example selected from CuZnSnSe, CuZnSnS, or any combination thereof, but is not limited thereto. The Group II-III-V semiconductor compound may include for example InZnP, but is not limited thereto.

The quantum dot may include the singular element semiconductor, the binary element semiconductor compound, the ternary element semiconductor compound, or the quaternary element semiconductor compound in a substantially uniform concentration or partially different concentration distributions. Each element included in a multi-element compound such as the binary element semiconductor compound, the ternary element semiconductor compound, and the quaternary element semiconductor compound may be present at a uniform or nonuniform concentration in a particle. In other words, a chemical formula representing the compound indicates a type of elements included in the compound but does not limit an element ratio of each element. All the elements included in each compound may have a different element ratio, for example, $AgInGaS_2$ may mean $AgIn_xGa_{1-x}S_2$ ($0 \leq x \leq 1$).

For example, the quantum dot may include a cadmium (Cd)-free quantum dot. Cadmium (Cd) may cause severe environment/health problems and a restricted element by Restriction of Hazardous Substances Directive (RoHS) in a plurality of countries, and thus the non-cadmium-based quantum dot may be effectively used. In an example, the light emitting layer 13 may not include cadmium. An example of the light emitting layer 13 may not include cadmium, lead, mercury, or any combination thereof.

As an example, the quantum dot may be a semiconductor compound including zinc (Zn), and at least one of tellurium (Te) and selenium (Se). For example, the quantum dot may be a Zn—Te semiconductor compound, a Zn—Se semiconductor compound, and/or a Zn—Se—Te semiconductor compound. For example, a mole fraction of tellurium (Te) in the Zn—Se—Te semiconductor compound may be smaller than a mole fraction of selenium (Se). The semiconductor compound may have a maximum emission wavelength in a wavelength region of less than or equal to about 480 nm, for example, about 430 nm to about 480 nm, and may be configured to emit blue light.

For example, the quantum dot may be a semiconductor compound including indium (In) and at least one of zinc (Zn) and phosphorus (P). For example, the quantum dot may be an In—P semiconductor compound and/or an In—Zn—P semiconductor compound. For example, in the In—Zn—P semiconductor compound, a mole ratio of zinc (Zn) to indium (In) may be greater than or equal to about 25.

The quantum dot may have a core-shell structure wherein one quantum dot surrounds another quantum dot. For example, the core and the shell of the quantum dot may have an interface, and an element of at least one of the core or the shell in the interface may have a concentration gradient wherein the concentration of the element(s) of the shell decreases toward the core. For example, a material composition of the shell of the quantum dot has a higher energy bandgap than a material composition of the core of the quantum dot, and thereby the quantum dot may exhibit a quantum confinement effect.

The quantum dot may have one quantum dot core and a multi-layered quantum dot shell surrounding the core. Herein, the multi-layered shell has at least two shells wherein each shell may be a single composition, an alloy, and/or the one having a concentration gradient.

For example, a shell of a multi-layered shell that is far from the core may have a higher energy bandgap than a shell that is near to the core, and thereby the quantum dot may exhibit a quantum confinement effect.

For example, the quantum dot having a core-shell structure may for example include a core including a first semiconductor compound including zinc (Zn), and at least one of tellurium (Te), and selenium (Se) and a shell including a second semiconductor compound disposed on at least a portion of the core and having a different composition from that of the core.

For example, the first semiconductor compound may be a Zn—Se—Te-based semiconductor compound including zinc (Zn), selenium (Se), and tellurium (Te), for example, a Zn—Se-based semiconductor compound including a small amount of tellurium (Te), and for example, a semiconductor compound represented by $ZnSe_{1-x}Te_x$ (where x is greater than 0 and less than or equal to about 0.05).

For example, in the first Zn—Se—Te-based semiconductor compound, a mole fraction of zinc (Zn) may be greater than a mole fraction of selenium (Se), and a mole fraction of selenium (Se) may be greater than a mole fraction of tellurium (Te). For example, in the first semiconductor compound, a mole ratio of tellurium (Te) relative to selenium (Se) may be less than or equal to about 0.05, less than or equal to about 0.049, less than or equal to about 0.048, less than or equal to about 0.047, less than or equal to about 0.045, less than or equal to about 0.044, less than or equal to about 0.043, less than or equal to about 0.042, less than or equal to about 0.041, less than or equal to about 0.04, less than or equal to about 0.039, less than or equal to about 0.035, less than or equal to about 0.03, less than or equal to about 0.029, less than or equal to about 0.025, less than or equal to about 0.024, less than or equal to about 0.023, less than or equal to about 0.022, less than or equal to about 0.021, less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, or less than or equal to about 0.01. For example, in the first semiconductor compound, a mole ratio of tellurium (Te) relative to zinc (Zn) may be less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, or less than or equal to about 0.010.

The second semiconductor compound may include for example a Group II-VI semiconductor compound, a Group III-V semiconductor compound, a Group IV-VI semiconductor compound, a Group IV semiconductor, a Group I-III-VI semiconductor compound, a Group I-II-IV-VI semiconductor compound, a Group II-III-V semiconductor compound, or any combination thereof. Examples of the Group II-VI semiconductor compound, the Group III-V semiconductor compound, the Group IV-VI semiconductor compound, the Group IV semiconductor, the Group I-III-VI semiconductor compound, the Group I-II-IV-VI semiconductor compound, and the Group II-III-V semiconductor compound are the same as described above.

For example, the second semiconductor compound may include zinc (Zn), as well as selenium (Se), and/or sulfur (S). For example, the shell may include ZnSeS, ZnS, or any combination thereof, and may include at least one inner shell disposed near to the core and an outermost shell disposed at the outermost shell of the quantum dot and the inner shell may include ZnSeS and the outermost shell may include ZnS. For example, the shell may have a concentration gradient of one component and for example an amount of sulfur (S) may increase as being apart from the core.

For example, a quantum dot having a core-shell structure may include a core including a third semiconductor compound including indium (In) and at least one of zinc (Zn) and phosphorus (P) and a shell disposed on at least a portion of the core and including a fourth semiconductor compound having a composition different from the core.

In the In—Zn—P-based third semiconductor compound, a mole ratio of zinc (Zn) to indium (In) may be greater than or equal to about 25. For example, in the In—Zn—P-based third semiconductor compound, the mole ratio of zinc (Zn) to indium (In) may be greater than or equal to about 28, greater than or equal to about 29, or greater than or equal to about 30. For example, in the In—Zn—P-based third semiconductor compound, the mole ratio of zinc (Zn) to indium (In) may be less than or equal to about 55, for example less than or equal to about 50, less than or equal to about 45, less than or equal to about 40, less than or equal to about 35, less than or equal to about 34, less than or equal to about 33, or less than or equal to about 32.

The fourth semiconductor compound may include, for example, a Group II-VI semiconductor compound, a Group III-V semiconductor compound, a Group IV-VI semiconductor compound, a Group IV semiconductor, a Group I-III-VI semiconductor compound, a Group I-II-IV-VI semiconductor compound, a Group II-III-V semiconductor compound, or any combination thereof. Examples of the Group II-VI semiconductor compound, Group III-V semiconductor compound, Group IV-VI semiconductor compound, Group IV semiconductor, Group I-III-VI semiconductor compound, Group I-II-IV-VI semiconductor compound, and Group II-III-V semiconductor compound are the same as described above.

For example, the fourth semiconductor compound may include zinc (Zn) and sulfur (S) and optionally selenium (Se). For example, the shell may include ZnSeS, ZnS, or any combination thereof. For example, the shell may include at least one inner shell disposed close to the core and an outermost shell disposed at the outermost side of the quantum dot. At least one of the inner shell and the outermost shell may include a fourth semiconductor compound of ZnS, or ZnSeS.

The aforementioned quantum dots are commercially available or may be appropriately synthesized.

In the quantum dot device 10 of an example, the quantum dot(s) may include a first organic ligand on the surface thereof. The organic ligand may coordinate onto the surfaces of the prepared semiconductor nanoparticles and allow the semiconductor nanoparticles to be well dispersed in a solvent. The first organic ligand may have a hydrophobic moiety. The first organic ligand may be bound to the surface of the quantum dot. The first organic ligand may include $RCOOH$, $RNH_2$, $R_2NH$, $R_3N$, $RSH$, $R_3PO$, $R_3P$, $ROH$, $RCOOR$, $RPO(OH)_2$, $RHPOOH$, $R_2POOH$, or any combination thereof, wherein R is each independently a substituted or unsubstituted C3 (C5) to C40 aliphatic hydrocarbon group such as a substituted or unsubstituted C3 to C40 alkyl, alkenyl, etc., a substituted or unsubstituted C6 to C40 aromatic hydrocarbon group such as a substituted or unsubstituted C6 to C40 aryl group, a substituted or unsubstituted C3 to C40 heteroaryl group, etc., or any combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, benzyl thiol, and the like; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, trioctylamine, and the like; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and the like; a phosphine compound such as methyl phosphine, ethyl phosphine, propyl phosphine, butyl phosphine, pentyl phosphine, octylphosphine, dioctyl phosphine, tributylphosphine, trioctylphosphine, diphenyl phosphine, triphenyl phosphine, and the like; a phosphine oxide compound such as methyl phosphine oxide, ethyl phosphine oxide, propyl phosphine oxide, butyl phosphine oxide, pentyl phosphine oxide, tributylphosphine oxide, octylphosphine oxide, dioctyl phosphine oxide, trioctylphosphine oxide; diphenyl phosphine oxide, triphenyl phosphine oxide, and the like; C5 to C20 alkylphosphinic acid such as hexylphosphinic acid, octylphosphinic acid, dodecanephosphinic acid, tetradecanephosphinic acid, hexadecanephosphinic acid, octadecanephosphinic acid, C5 to C20 alkyl phosphonic acid such as hexylphosphonic acid, octylphosphonic acid, dodecane phosphonic acid, tetradecane phosphonic acid, hexadecane phosphonic acid, octadecane phosphonic acid; and the like, but are not limited thereto. The quantum dots may include a hydrophobic organic ligand alone or in a mixture of at least two type.

The quantum dots may include a halogen together with an organic ligand (e.g., C5 or higher or C10 or higher fatty acid compound, e.g., oleic acid) on the surface (hereinafter referred to as "halogen-treated quantum dots"). The content of halogen in halogen-treated quantum dots may be for example greater than or equal to about 1 microgram (μg), greater than or equal to about 1.5 μg, greater than or equal to about 3 μg, greater than or equal to about 4 μg, greater than or equal to about 5 μg, greater than or equal to about 6 μg, greater than or equal to about 7 μg, greater than or equal to about 8 μg, greater than or equal to about 9 μg, greater than or equal to about 10 μg, greater than or equal to about 11 μg, greater than or equal to about 12 μg, greater than or equal to about 12.5 μg, greater than or equal to about 13 μg, greater than or equal to about 14 μg, greater than or equal to about 15 μg, greater than or equal to about 16 μg, greater than or equal to about 17 μg, greater than or equal to about 18 μg, or greater than or equal to about 19 μg and less than about 30 μg, less than or equal to about 25 μg, less than or equal to about 20 μg, less than or equal to about 19. 5 μg, less than or equal to about 19 μg, less than or equal to about 18 μg, less than or equal to about 17 μg, less than or equal to about 15 μg, less than or equal to about 12.5 μg, or less than or equal to about 12 μg per milligram (mg) of quantum dots, when confirmed by ion chromatography. The halogen may be chlorine.

An example of a method of preparing the halogen-treated quantum dots may include obtaining an organic dispersion including a plurality of quantum dots including a first organic ligand on the surface and a first organic solvent; obtaining a chloride solution including a polar organic solvent miscible with the first organic solvent and a metal halide; and adding the chloride solution to the organic dispersion so that the content of the metal halide is greater than or equal to about 0.1 weight percent (wt %) and less than or equal to about 10 wt % based on the total weight of the quantum dots, and then stirring the resultant at a temperature of greater than or equal to about 45° C., for example, greater than or equal to about 50° C., greater than or equal to about 55° C., or greater than or equal to about 60° C. and less than or equal to about 150° C., less than or equal to about 140° C., less than or equal to about 100° C., less than or equal to about 90° C., less than or equal to about 80° C., or less than or equal to about 70° C. A volume ratio of the polar organic solvent to the first organic solvent may be less than or equal to about 0.1:1, respectively.

The metal halide (e.g., metal chloride) may include a zinc halide, an indium halide, a gallium halide, a magnesium halide, a lithium halide, or any combination thereof. The first organic solvent may include a substituted or unsubstituted C5 to C40 aliphatic hydrocarbon, a substituted or unsubstituted C6 to C40 aromatic hydrocarbon, a substituted or unsubstituted C3 to C40 alicyclic hydrocarbon, or any combination thereof. The polar organic solvent may include a C1 to C10 alcohol (e.g., methanol, ethanol, propanol, isopropanol, butanol, pentanol, hexanol, heptanol, etc.) or any combination thereof.

The light emitting layer 13 may have a single layer or a multilayer structure in which two or more layers are stacked. In the multilayer structure, adjacent layers (e.g., the first light emitting layer and the second light emitting layer) may have different physical properties/compositions. At least one of the light emitting layers 13 of an example may further include a halogen (e.g., chlorine). The light emitting layer 13 of an example may exhibit a gradient halogen content that varies in a thickness direction.

The light emitting layer 13 of an example may exhibit a carbon content that varies along a thickness direction. In an example of the light emitting layer 13, the carbon content may increase as it approaches the second hole auxiliary layer 15. In an example of the light emitting layer 13, the carbon content may decrease as it approaches the second hole auxiliary layer 15.

An example of the light emitting layer 13 may include a layer (hereinafter, referred to as a surface-treated first light emitting layer or a first layer) including quantum dots and having a surface treated with halogen (e.g., chlorine). A second layer including the halogen-treated quantum dots and/or a third layer including quantum dots having organic ligands may be disposed on the first layer. The second layer may be disposed between the first layer and the third layer. The organic material (e.g., carbon) content (e.g., concentration) of the first layer may be lower than the organic material content of the second layer. The halogen (e.g., chlorine) content (e.g., concentration) of the first layer may be higher than the halogen content of the second layer. The organic material content of the first layer may be higher than the organic material content of the second layer. The halogen content of the first layer may be lower than the organic material content of the second layer. The organic material content of the light emitting layer 13 may be controlled by an appropriate means (post-treatment for the formed layer).

The light emitting layer 13 may have a relatively deep HOMO energy level, for example, a HOMO energy level of greater than or equal to about 5.4 eV, for example, greater than or equal to about 5.6 eV, within the above range, for example, greater than or equal to about 5.7 eV, for example greater than or equal to about 5.8 eV, for example greater than or equal to about 5.9 eV, for example, greater than or equal to about 6.0 eV. The HOMO energy level of the light emitting layer 13 may be, within the above range, for example, about 5.4 eV to about 7.0 eV, for example, about 5.4 eV to about 6.8 eV, for example, about 5.4 eV to about 6.7 eV, for example, about 5.4 eV to about 6.5 eV, for example, about 5.4 eV to about 6.3 eV, for example, about 5.4 eV to about 6.2 eV, for example, about 5.4 eV to about 6.1 eV, within the above range, for example, about 5.6 eV to about 7.0 eV, for example, about 5.6 eV to about 6.8 eV, for example, about 5.6 eV to about 6.7 eV, for example, about 5.6 eV to about 6.5 eV, for example, about 5.6 eV to about 6.3 eV, for example, about 5.6 eV to about 6.2 eV, for example, about 5.6 eV to about 6.1 eV, within the above range, for example, about 5.7 eV to about 7.0 eV, for example, about 5.7 eV to about 6.8 eV, for example, about 5.7 eV to about 6.7 eV, for example, about 5.7 eV to about 6.5 eV, for example, about 5.7 eV to about 6.3 eV, for example, about 5.7 eV to about 6.2 eV, for example, about 5.7 eV to about 6.1 eV, within the above range, for example, about 5.8 eV to about 7.0 eV, for example, about 5.8 eV to about 6.8 eV, for example, about 5.8 eV to about 6.7 eV, for example, about 5.8 eV to about 6.5 eV, for example, about 5.8 eV to about 6.3 eV, for example, about 5.8 eV to about 6.2 eV, for example, about 5.8 eV to about 6.1 eV, within the above range, for example, about 6.0 eV to about 7.0 eV, for example, about 6.0 eV to about 6.8 eV, for example, about 6.0 eV to about 6.7 eV, for example, about 6.0 eV to about 6.5 eV, for example, about 6.0 eV to about 6.3 eV, for example, about 6.0 eV to about 6.2 eV.

The light emitting layer 13 may have a relatively shallow LUMO energy level, for example, less than or equal to about 3.6 eV, within the above range, for example, less than or equal to about 3.5 eV, for example, less than or equal to about 3.4 eV, for example, less than or equal to about 3.3 eV, for example, less than or equal to about 3.2 eV, or for example, less than or equal to about 3.0 eV. Within the above range, the LUMO energy level of the light emitting layer 13 may be about 2.5 eV to about 3.6 eV, about 2.5 eV to about 3.5 eV, for example, about 2.5 eV to about 3.4 eV, for example, about 2.5 eV to about 3.3 eV, for example, about 2.5 eV to about 3.2 eV, for example, about 2.5 eV to about 3.1 eV, for example, about 2.5 eV to about 3.0 eV, for example, about 2.8 eV to about 3.6 eV, about 2.8 eV to about 3.5 eV, for example, about 2.8 eV to about 3.4 eV, for example, about 2.8 eV to about 3.3 eV, for example, about 2.8 eV to about 3.2 eV, about 3.0 eV to about 3.6 eV, about 3.0 eV to about 3.5 eV, or for example, about 3.0 eV to about 3.4 eV.

The light emitting layer 13 may have an energy bandgap of about 2.4 eV to 3.9 eV. Within the above range, it may have an energy bandgap, for example, about 2.5 eV to about 3.8 eV, within the above range, for example, about 2.6 eV to about 3.7 eV.

A thickness of the light emitting layer 13 may be less than or equal to about 200 nm, for example, about 5 nm to about 200 nm, about 10 nm to about 200 nm, about 20 nm to about 150 nm, about 20 nm to about 100 nm, about 30 nm to about 100 nm, about 20 nm to about 80 nm, or about 30 nm to about 80 nm.

The first hole auxiliary layer 14 and the second hole auxiliary layer 15 may be a functional layer disposed between the first electrode 11 and the light emitting layer 13 to improve electrical performance between the first electrode 11 and the light emitting layer 13. The first hole auxiliary layer 14 and the second hole auxiliary layer 15 may increase hole injection and transport from the first electrode 11 to the light emitting layer 13, for example, the first hole auxiliary layer 14 may be a hole injection layer HIL increasing the hole injection from the first electrode 11, and the second hole auxiliary layer 15 may be a hole transport layer increasing the hole transport to the light emitting layer 13. At least either one of the first hole auxiliary layer 14 and the second hole auxiliary layer 15 may have electron-blocking characteristics.

The first hole auxiliary layer 14 may be disposed proximate to the first electrode 11 and between the first electrode 11 and the light emitting layer 13, and the second hole auxiliary layer 15 may be disposed proximate to the light emitting layer 13 and between the first electrode 11 and the light emitting layer 13.

The first hole auxiliary layer 14 may have a first surface 14-1 proximate to the first electrode 11 and a second surface 14-2 proximate to the second hole auxiliary layer 15. For example, the first surface 14-1 of the first hole auxiliary layer 14 may be in contact with a surface of the first electrode 11, and the second surface 14-2 of the first hole auxiliary layer 14 may be in contact with a surface of the second hole auxiliary layer 15.

The first hole auxiliary layer 14 includes a hole auxiliary region 14a having a predetermined thickness from the first surface 14-1 and a surface modification region 14b having a very thin thickness on the second surface 14-2.

The hole auxiliary region 14a may be a region into which holes are injected from the first electrode 11 and include poly(3,4-ethylenedioxythiophene)polystyrene sulfonate or a derivative thereof (hereinafter, referred to as 'PEDOT:PSS') having high hole injection characteristics. For example, the derivative may include a structure in which at least one hydrogen of the 'PEDOT:PSS' is substituted with a substituent as defined herein. The PEDOT:PSS may have a HOMO energy level of greater than or equal to about 5.10 eV and less than about 5.20 eV, and therefore, provide satisfactory hole injection characteristics from the first electrode 11. In addition, since the PEDOT:PSS may be dissolved in a polar solvent such as alcohol, a solution process such as spin coating may be adopted to apply or deposit the hole auxiliary region 14a. The hole auxiliary region 14a may be a main region occupying most of the first hole auxiliary layer 14, and a thickness of the hole auxiliary region 14a may correspond to about 70% to about 99% of a thickness of the first hole auxiliary layer 14.

The surface modification region 14b may be located at an interface of the hole auxiliary region 14a and the second hole auxiliary layer 15 and include a surface modification material capable of improving hole injection and/or transport characteristics between the hole auxiliary region 14a and the second hole auxiliary layer 15. The surface modification material may be present at or proximate to the second surface 14-2 of the first hole auxiliary layer 14 and form a chemical interaction with the PEDOT:PSS of the hole auxiliary region 14a. The surface modification material may have a deeper HOMO energy level than that of the PEDOT:PSS and a shallower HOMO energy level than that of a hole transport material of the second hole auxiliary layer 15, which is described later. The surface modification material may increase hole mobility and effectively reduce an energy level difference between the hole auxiliary region 14a and the second hole auxiliary layer 15, thereby improving hole injection and/or transport characteristics.

For example, the surface modification material may include oxygen anions (or oxo functionality) capable of forming a noncovalent secondary bond interaction with the sulfonium ions of the PEDOT:PSS or a material capable of forming the oxygen anions.

For example, the surface modification material may be an organic compound containing oxygen anions or having a functional group capable of forming oxygen anions, for example, an organic compound having carboxylic acid group, phosphonic acid group, sulfonic acid group, or a respective salt of each derived therefrom. Since this surface modification material may be dissolved in a polar solvent such as alcohol, like the PEDOT:PSS, a solution process such as spin coating may also be adopted.

For example, the surface modification material may include a moiety having hole characteristics and a functional group including an oxygen anion or capable of forming an oxygen anion. The moiety having hole characteristics may have hole transport characteristics along a HOMO level to facilitate injection and/or transport of holes from the anode, for example, have a conjugation system. The moiety having hole characteristics is a moiety that controls the HOMO energy level of the surface modification material, and may provide an HOMO energy level which is deeper than that of the PEDOT:PSS but shallower than that of the hole transport material of the second hole auxiliary layer 15. The functional group may be a carboxylic acid group, a phosphonic acid group, a sulfonic acid group, or a salt derived therefrom capable of forming a non-covalent secondary bonding interaction with sulfonium ions of the PEDOT:PSS, as described above.

The surface modification material may be for example represented by Chemical Formula 1.

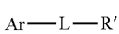

Chemical Formula 1

In Chemical Formula 1,
Ar may be a moiety having hole characteristics, and may be a substituted or unsubstituted C6 to C20 aryl group, a substituted or unsubstituted C3 to C20 heteroaryl group, or any combination thereof;
L may be a linking group, and
R' may be a functional group including an oxygen anion or capable of forming an oxygen anion.
Ar of Chemical Formula 1 may be for example a substituted or unsubstituted phenyl group, a substituted or unsubstituted naphthyl group, a substituted or unsubstituted anthracenyl group, a substituted or unsubstituted fluorenyl group, a substituted or unsubstituted carbazolyl group, a substituted or unsubstituted dibenzofuranyl group, a substituted or unsubstituted dibenzothiophenyl group, or any combination thereof.
L of Chemical Formula 1 may be a single bond or a divalent organic group, and may be for example a single bond, a substituted or unsubstituted C1 to C20 alkylene group, a substituted or unsubstituted C6 to C20 arylene group, a substituted or unsubstituted C3 to C20 heteroarylene group, or any combination thereof. L of Chemical Formula 1 may be for example a single bond, a substituted or unsubstituted methylene group, a substituted or unsubstituted ethylene group, a substituted or unsubstituted propylene group, a substituted or unsubstituted butylene group, a substituted or unsubstituted phenylene group, a substituted or unsubstituted carbazolylene group, a substituted or unsubstituted dibenzofuranylene group, a substituted or unsubstituted dibenzothiophenylene group, or any combination thereof.
R' of Chemical Formula 1 may be for example a carboxylic acid group, a phosphonic acid group, a sulfonic acid group, or a salt thereof.
For example, the HOMO energy level of the surface modification material may be about 5.20 eV to about 5.60 eV, and within the above range, about 5.20 eV to about 5.40 eV or 5.25 eV to about 5.35 eV.

The surface modification region 14b may be formed by coating a solution including the surface modification material on the hole auxiliary region 14a in a solution process, for example, spin coating to provide a relatively thin thickness like a monolayer on the surface of the hole auxiliary region 14a by forming a non-covalent secondary bond interaction with the sulfonium ions of PEDOT:PSS of the hole auxiliary region 14a, and the process may include solvent removal, a heat treatment, or the like.

The surface modification region 14b may be thinner than the hole auxiliary region 14a. For example, the thickness of the surface modification region 14b may be about 1% to about 30% of a total thickness of the first hole auxiliary layer 14 and within the above range, about 1% to about 20%, about 1% to about 15% or about 1% to about 10%. Accordingly, an amount by volume of the surface modification material may be less included than an amount by volume of the PEDOT:PSS in the first hole auxiliary layer 14, for example, an amount of the surface modification material in the first hole auxiliary layer 14 may be about 1 volume percent (vol %) to about 30 vol % based on a total amount of the PEDOT:PSS and the surface modification material and within the above range, about 1 vol % to about 20 vol %, about 1 vol % to about 15 vol %, or about 1 vol % to about 10 vol %.

For example, the thickness of the surface modification region 14b may be greater than or equal to about 1 nm and less than about 10 nm and within the above range, about 1 nm to about 8 nm, about 1 nm to about 7 nm, about 1 nm to about 5 nm, or about 1 nm to about 3 nm.

As described above, the second surface 14-2 of the first hole auxiliary layer 14 includes the surface modification region 14b including the surface modification material, thereby not only increasing an interaction with the PEDOT:PSS included in the hole auxiliary region 14a to further increase hole mobility, as well as may be effectively reducing an energy barrier with the second hole auxiliary layer 15 to further improve hole injection and/or transport characteristics.

When the first hole auxiliary layer 14 is composed of only the hole auxiliary region 14a including the PEDOT:PSS without the surface modification region 14b, residual charges, e.g., a charge that does not move from first hole auxiliary layer 14 to the second hole auxiliary layer 15 may accumulate at the interface between the first hole auxiliary layer 14 and the second hole auxiliary layer 15 due to relatively low hole mobility and the energy barrier between the first hole auxiliary layer 14 and the second hole auxiliary layer 15, the result of which may lead to deteriorating life-span characteristics. On the other hand, the presence of a surface modification region 14b including the surface modification material in the second surface 14-2 of the first hole auxiliary layer 14 may increase hole transportability from the first hole auxiliary layer 14 to the second hole auxiliary layer 15, and thereby, reduce or prevent the accumulation of residual charges and improve upon life-span characteristics of the quantum dot device 10.

The second hole auxiliary layer 15 may be disposed between the first hole auxiliary layer 14 and the light emitting layer 13, and one surface of the second hole auxiliary layer 15 may be in contact with the surface modification region 14b of the first hole auxiliary layer 14, while the other surface of the second hole auxiliary layer 15 may be in contact with the light emitting layer 13.

The second hole auxiliary layer 15 may include a hole transport material different from the material included in the first hole auxiliary layer 14, and for example, the HOMO energy level of the hole transport material included in the second hole auxiliary layer 15 may be deeper than the HOMO energy levels of PEDOT:PSS of the first hole auxiliary layer 14 and the aforementioned surface modification material, respectively. For example, the HOMO energy level of the hole transport material included in the second hole auxiliary layer 15 may be about 5.3 eV to about 7.0 eV, within the above range, for example, about 5.4 eV to 6.8 eV, for example, about 5.4 eV to 6.7 eV, such as about 5.4 eV to 6.5 eV, such as about 5.4 eV to 6.3 eV, such as about 5.4 eV to 6.2 eV, such as about 5.4 eV to 6.1 eV, such as about 5.6 eV to 7.0 eV, such as about 5.6 eV to 6.8 eV, such as about 5.6 eV to 6.7 eV, such as about 5.6 eV to 6.5 eV, such as about 5.6 eV to 6.3 eV, such as about 5.6 eV to 6.2 eV, such as about 5.6 eV to 6.1 eV, such as about 5.8 eV to 7.0 eV, such as about 5.8 eV to 6.8 eV, such as about 5.8 eV to 6.7 eV, such as about 5.8 eV to 6.5 eV, such as about 5.8 eV to 6.3 eV, such as about 5.8 eV to 6.2 eV, such as about 5.8 eV to 6.1 eV.

For example, the HOMO energy level of the surface modification material described above may be deeper than the HOMO energy level of PEDOT:PSS of the first hole auxiliary layer 14 and shallower than the HOMO energy level of the hole transport material included in the second hole auxiliary layer 15. Moreover, the HOMO energy level of the quantum dots of the light emitting layer 13 may be deeper than the HOMO energy level of the hole transport material of the second hole auxiliary layer 15. Accordingly, the HOMO energy levels of the hole auxiliary region 14a and the surface modification region 14b of the first hole auxiliary layer 14, the second hole auxiliary layer 15, and the light emitting layer 13 may provide sequentially deepened HOMO energy levels.

The hole transport material included in the second hole auxiliary layer 15 may include, for example, N,N,N',N'-tetrakis(4-methoxyphenyl)-benzidine (TPD), N,N'-bis(1-naphthyl)-N, N'-diphenyl-(1,1'-biphenyl)-4,4'-diamine (NPD), 4,4',4"-tris[phenyl(m-tolyl)amino]triphenylamine (m-MTDATA), 4,4',4"-tris(N-carbazolyl)-triphenylamine, TCTA), 1,1-bis[(di-4-tolylamino)phenyl]cyclohexane (TAPC), N2,N7-di(naphthalen-1-yl)-9,9-dioctyl-N2,N7-di-phenyl-9H-fluorene-2,7-diamine (NPB), 2,7-bis(carbazol-9-yl)-9,9-spirobifluorene (Spiro-2CBP), 2,2',7,7'-Tetra(N,N-di-p-tolyl)amino-9,9-spirobifluorene (Spiro-TTB), 2,2',7,7'-tetrakis(N,N-diphenylamino)-9,9-spirobifluorene (Spiro-TAD), 1,1-bis[(di-4-tolylamino)phenyl]cyclohexane (TAPC), 4,4'-Bis(N-carbazolyl)-1,1'-biphenyl (CBP), 4,4', 4"-tris[2-naphthyl(phenyl)amino]triphenylamine (2-TNATA), 1,3,5-tris (4-diphenylaminophenyl)benzene (TDAPB), poly(9,9-dioctyl-fluorene-co-N-(4-butylphenyl)-diphenylamine) (TFB), polyarylamine, poly(N-vinylcarbazole), polyaniline, polypyrrole, Spiro-PMATD, triphenylbismuth dichloride (TPBC), poly(triaryl amine) (PTAA), poly (3-hexylthiophene-2,5-diyl) (P3HT), poly[3-(5-carboxypentyl)thiophene-2,5-diyl] (P3CPenT), poly[2,6-(4, 4-bis-(2-ethylhexyl)-4H-cyclopenta[2,1-b;3,4-b'] dithiophene)-alt-4,7 (2,1,3-benzothiadiazole)]-(PCPDT-t), poly ferric sulfate (PFS), CuI, $Cu_2O$, CuO, CuS, NiOx, $CuGaO_2$, CuPc, CuSCN, $MoO_x$, $MoS_2$, $VO_x$, $CoO_x$, graphene oxide, or any combination thereof, but is not limited thereto.

Each of the respective first hole auxiliary layer 14 and the second hole auxiliary layer 15 may have a thickness, for example, about 10 nm to about 100 nm, and within the above range, about 10 nm to about 80 nm, about 15 nm to about 80 nm, about 15 nm to about 60 nm, or about 20 nm to about 60 nm.

The electron auxiliary layer 16 may be a functional layer that improves electrical performance between the second electrode 12 and the light emitting layer 13 and may increase transport of electrons from the second electrode 12 to the light emitting layer 13. The electron auxiliary layer 16 may block reverse injection of holes from the light emitting layer 13 to the second electrode 12. The electron auxiliary layer 16 may have one layer or two or more layers. The electron auxiliary layer 16 may include one or more, e.g., two or more, electron auxiliary materials, and the electron auxiliary material(s) may be an electron transport material and/or an electron injection material.

A LUMO energy level of the electron auxiliary material may be deeper than a LUMO energy level of the light emitting layer 13 (quantum dots included in the light emitting layer 13). A difference between the LUMO energy level of the electron auxiliary material and the LUMO energy level of the light emitting layer 13 (quantum dots included in the light emitting layer 13) may be less than or equal to about 2.5 eV, and within the above range, less than or equal to about 2.3 eV, less than or equal to about 2.0 eV, or less than or equal to about 1.8 eV. The LUMO energy level of the electron auxiliary material may be each, for example, about 2.5 eV to about 4.8 eV, and within the above range, for example, about 2.6 eV to about 4.6 eV or about 2.7 eV to about 4.5 eV.

A HOMO energy level of the electron auxiliary material may be deeper than a HOMO energy level of the light emitting layer 13 (quantum dots included in the light emitting layer 13). For example, the HOMO energy level of the electron auxiliary material may be deeper than the HOMO energy level of the light emitting layer 13 (quantum dots included in the light emitting layer 13) by greater than or equal to about 0.2 eV, greater than or equal to about 0.5 eV, greater than or equal to about 0.8 eV, greater than or equal to about 1.0 eV, greater than or equal to about 1.2 eV, or greater than or equal to about 1.5 eV, for example, about 0.2 eV to about 3.0 eV, about 0.5 eV to about 3.0 eV, about 0.8 eV to about 3.0 eV, about 1.0 eV to about 3.0 eV, about 1.2 eV to about 3.0 eV, or about 1.5 eV to about 3.0 eV.

For example, the HOMO energy level of the electron auxiliary material may be for example about 5.6 eV to about 8.5 eV, within the above range, about 5.8 eV to about 8.2 eV, about 6.0 eV to about 8.0 eV, about 6.2 eV to about 8.0 eV, about 6.5 eV to about 8.0 eV, about 6.8 eV to about 8.0 eV, about 7.0 eV to about 8.0 eV, about 7.2 eV to about 7.9 eV, or about 7.3 eV to about 7.8 eV.

For example, the energy bandgap of the electron auxiliary material may be greater than or equal to about 2.0 eV and less than about 4.0 eV, and within the above range, about 2.1 eV to about 3.9 eV, about 2.3 eV to about 3.8 eV, or about 2.5 eV to about 3.8 eV.

For example, the electron auxiliary material may include inorganic nanoparticles. The inorganic nanoparticles may be for example oxide nanoparticles, or for example, metal oxide nanoparticles, and for example, the inorganic nanoparticles may be metal oxide nanoparticles including two or more types of metals. The inorganic nanoparticles may be for example inorganic semiconductors and may be for example n-type inorganic nanoparticles.

The inorganic nanoparticles may be two-dimensional or three-dimensional nanoparticles having an average particle diameter of less than about 10 nm, within the above range, less than or equal to about 8 nm, less than or equal to about 7 nm, less than or equal to about 6 nm, less than or equal to about 5 nm, less than or equal to about 4 nm, or less than or equal to about 3.5 nm, within the above range, greater than or equal to about 1 nm and less than about 10 nm, about 1 nm to about 9 nm, about 1 nm to about 8 nm, about 1 nm to about 7 nm, about 1 nm to about 6 nm, about 1 nm to about 5 nm, about 1 nm to about 4 nm, or about 1 nm to about 3.5 nm.

The HOMO energy level of the inorganic nanoparticles may be, for example, about 5.6 eV to about 8.5 eV, about 5.8 eV to about 8.2 eV, about 6.0 eV to about 8.0 eV, about 6.2 eV to about 8.0 eV, about 6.5 eV to about 8.0 eV, about 6.8 eV to about 8.0 eV, about 7.0 eV to about 8.0 eV, about 7.2 eV to about 7.9 eV, or about 7.3 eV to about 7.8 eV.

The LUMO energy level of the inorganic nanoparticles may be, for example, about 2.5 eV to about 4.8 eV, about 2.6 eV to about 4.6 eV, or about 2.7 eV to about 4.5 eV.

The inorganic nanoparticles may be selected from materials satisfying the aforementioned energy level, for example, a metal oxide nanoparticle including at least one selected from zinc (Zn), magnesium (Mg), cobalt (Co), nickel (Ni), gallium (Ga), aluminum (Al), calcium (Ca), zirconium (Zr), tungsten (W), lithium (Li), titanium (Ti), tantalum (Ta), tin (Sn), and barium (Ba).

For example, the inorganic nanoparticles may include metal oxide nanoparticles including zinc (Zn), for example, metal oxide nanoparticles represented by $Zn_{1-x}Q_xO$ ($0 \le x < 0.5$). Herein, Q may include one or more metals other than Zn, such as magnesium (Mg), cobalt (Co), nickel (Ni), gallium (Ga), aluminum (Al), calcium (Ca), zirconium (Zr), tungsten (W), lithium (Li), titanium (Ti), tantalum (Ta), tin (Sn), hafnium (Hf), silicon (Si), barium (Ba), or any combination thereof. For example, Q may include magnesium (Mg).

The metal oxide nanoparticles represented by $Zn_{1-x}Q_xO$ ($0 \le x < 0.5$) may further include an additional metal selected from an alkali metal, Ca, Zr, W, Li, Ti, Y, Al, or a combination thereof. The alkali metal may include lithium, sodium, potassium, rubidium, cesium, or a combination thereof. For example, Q may include magnesium (Mg).

For example, x may satisfy the range of $0.01 \le x \le 0.4$, $0.01 \le x \le 0.3$, or $0.01 \le x \le 0.2$.

The electron auxiliary material may further include an alkali metal, an alkali metal compound, or any combination thereof, in addition to the aforementioned inorganic nanoparticles. The alkali metal, alkali metal compound, or combination thereof may be included in the form of a mixture with the aforementioned inorganic nanoparticles, and may be included in a limited amount in the electron auxiliary layer 16 to effectively improve the electrical characteristics of the electron auxiliary layer 16.

The alkali metal, alkali metal compound, or combination thereof may be included in the form of, for example, an alkali metal cation, an alkali metal cation derived from an alkali metal compound, or any combination thereof. The alkali metal compound may be included in the form of, for example, an alkali metal cation and a counter anion. The alkali metal cation may be derived from the alkali metal compound. The alkali metal compound may be a compound including an alkali metal, for example, alkali carbonate, alkali phosphate, alkali vanadate, alkali azide, alkali nitride, or any combination thereof.

The alkali metal or alkali metal included in the alkali metal compound may be for example lithium (Li), sodium (Na), potassium (K), cesium (Cs), rubidium (Rb), francium (Fr), or any combination thereof. These lithium (Li), sodium (Na), potassium (K), cesium (Cs), rubidium (Rb), or francium (Fr) may be included in a form of a lithium cation, a sodium cation, a potassium cation, a cesium cation, a rubidium cation, or a francium cation, respectively.

The alkali metal compound (e.g., alkali metal salt) may further include an anion such as carbonate ($CO_3^{2-}$), phosphate ($PO_4^{3-}$), vanadate ($VO_4^{3-}$), azide ($N_3^-$), or nitride ($N^{3-}$), in addition to the alkali metal cation.

For example, the alkali metal may be lithium (Li), sodium (Na), potassium (K), cesium (Cs), rubidium (Rb), francium (Fr), or any combination thereof, and the alkali metal compound may be cesium carbonate ($Cs_2CO_3$), cesium phosphate ($Cs_3PO_4$), cesium vanadate ($Cs_3VO_4$), cesium azide ($CsN_3$), lithium carbonate ($LiCO_3$), lithium nitride ($LisN$), sodium carbonate ($Na_2CO_3$), potassium carbonate ($K_2CO_3$), rubidium carbonate ($Rb_2CO_3$), or any combination thereof, but is not limited thereto.

In the electron auxiliary layer 16, the total alkali metal derived from the alkali metal, alkali metal compound, or combination thereof may be included in a less amount than inorganic nanoparticles. For example, the total alkali metal may be included in an amount of about 0.1 vol % to about 30 vol %, within the above range, about 0.1 vol % to about 25 vol %, about 0.1 vol % to about 20 vol %, about 0.5 vol % to about 18 vol %, about 1 vol % to about 15 vol %, or about 3 vol % to about 15 vol % based on the total volume of the electron auxiliary layer 16. For example, the total alkali metal derived from the alkali metal, alkali metal compound, or combination thereof may be included in an amount of less than about 0.5 at % based on the total number of atoms included in the electron auxiliary layer 16.

A thickness of the electron auxiliary layer 16 may be for example about 10 nm to about 100 nm, within the above range, about 10 nm to about 80 nm, about 15 nm to about 80 nm, about 15 nm to about 60 nm, or about 20 nm to about 50 nm.

A method of manufacturing the aforementioned quantum dot device 10 may include forming the first electrode 11 on a substrate (not shown), forming the hole auxiliary region 14a, forming the surface modification region 14b on the hole auxiliary region 14a, forming the second hole auxiliary layer 15, forming the light emitting layer 13, forming the electron auxiliary layer 16, and forming the second electrode 12.

Each process of the forming of the hole auxiliary region 14a, the forming of the surface modification region 14b, the forming of the second hole auxiliary layer 15, the forming of the light emitting layer 13, and the forming of the electron auxiliary layer 16 may include a solution process, and may include, for example, spin coating, slit coating, inkjet printing, nozzle printing, spraying, and/or doctor blade coating, but is not limited thereto.

At least a portion of each process of the forming of the hole auxiliary region 14a, the forming of the surface modification region 14b, the forming of the second hole auxiliary layer 15, the forming of the light emitting layer 13, and the forming of the electron auxiliary layer 16 may further include optionally drying and/or heat treating after the solution process, and the heat-treating may be performed, for example, at about 50° C. to about 300° C. for about 1 minute to about 10 hours, but the present disclosure is not limited thereto.

The aforementioned quantum dot device 10 may be applied to various electronic devices such as, for example, a display device or a lighting device. For example, the aforementioned quantum dot device 10 may be applied to various electronic devices requiring light emission, for example, may be applied to various electronic devices such as a display device such as a TV, a monitor, a computer, laptop, a mobile phone, etc., or a lighting device such as a light source.

Hereinafter, the embodiments are illustrated in more detail with reference to examples. However, these examples are exemplary, and the scope of claims is not limited thereto.

Synthesis of Quantum Dot

Synthesis Example 1: Synthesis of Core-Shell Quantum Dot (1) Synthesis of Core Quantum Dot Selenium (Se) and tellurium (Te) are each respectively dispersed in trioctylphosphine (TOP) to prepare a 2 M Se/TOP stock solution, and separately, a 0.1 M Te/TOP stock solution.

In a reactor containing trioctylamine, 0.125 mmol of zinc acetate is combined with oleic acid and heated at 120° C. under vacuum. After 1 hour, nitrogen is introduced into the reactor. After heating the reactor to 300° C., the Se/TOP stock solution and the Te/TOP stock solution in a Te:Se mole ratio of 1:20, respectively, is rapidly injected into the reactor. When the reaction is complete, the reaction solution is rapidly cooled to room temperature, and acetone is added to the solution to facilitate formation of a precipitate. The resulting mixture is centrifuged to separate the precipitate, and the precipitate is dispersed in toluene to provide a ZnSeTe quantum dot dispersion.

(2) Synthesis of Core-Shell Quantum Dot

In a flask containing trioctylamine, 1.8 mmol of zinc acetate is combined with oleic acid and vacuum-treated at 120° C. for 10 minutes. Afterwards, nitrogen is introduced into the flask and the flask is heated to 180° C. The above-obtained ZnSeTe quantum dot dispersion is rapidly injected into the reaction flask, followed by the injection of the Se/TOP stock solution and the S/TOP stock solution in a Se:S mole ratio of 1.2:2.8, respectively, and the reaction mixture is heated to 340° C. When the reaction is complete, and the reaction solution (mixture) is cooled to room temperature, ethanol is added. The resulting nanocrystals are separated by centrifuge and dispersed in toluene, obtaining ZnSeTe/ZnSeS core-shell quantum dots.

(3) Surface Exchange Reaction

Zinc chloride is dissolved in ethanol, obtaining a zinc chloride solution at a concentration of 10 wt %. 0.01 mL of the zinc chloride solution is added to the obtained ZnSeTe/ZnSeS core-shell quantum dot dispersion and stirred at 60° C. for 30 minutes to perform a surface exchange reaction. After the reaction, ethanol is added to induce precipitation, and the precipitate is separated with a centrifuge, and then washed several times with ethanol to obtain halogenated ZnSeTe/ZnSeS core-shell quantum dots.

Synthesis Example 2: Synthesis of ZnS Nanoparticles

Sulfur is dispersed in trioctylphosphine (TOP) to obtain a 1 M S/TOP stock solution. Zinc acetate combined with oleic acid is dissolved in trioctylamine in a 300 mL reaction flask and heated to 120° C. under vacuum. After 1 hour, nitrogen is introduced into the reaction flask. After heating the flask to 300° C., the above-prepared S/TOP stock solution is rapidly injected into the flask. After 60 minutes, the reaction solution is rapidly cooled to room temperature, ethanol is added to facilitate formation of a precipitate, and the precipitate is separated with a centrifuge and dispersed in hexane obtaining ZnS nanoparticles. The amount of Zn and S precursor used in the reaction provides a mole ratio of Zn:S of 2:1, respectively.

Preparation of Quantum Dot Dispersion

Preparation Example 1

Quantum dot dispersion is prepared by precipitating the halogenated ZnSeTe/ZnSeS core-shell quantum dots of Synthesis Example 1 in ethanol, collecting the quantum dots by centrifugation and dispersing the quantum dots in octane.

Preparation Example 2

Quantum dot dispersion is prepared by dispersing the halogenated ZnSeTe/ZnSeS core-shell quantum dots of Synthesis Example 1 and ZnS nanoparticles of Synthesis Example 2 in a volume ratio of 1:1 in octane.

Preparation of Solution for Surface Modification

Preparation Example 3

Compound A (2PACz, TCI, CAS No. 20999-38-6) is prepared as a surface modification material.

Compound A

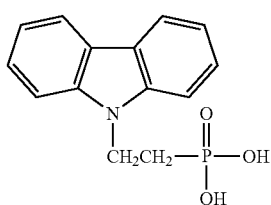

Compound A is dissolved in ethanol at a concentration of 0.1 wt %, preparing a solution for surface modification.
Preparation of Dispersion for Electron Auxiliary Layer Preparation Example 4

0.93 mmol of magnesium acetate tetrahydrate, 8.07 mmol of zinc acetate dihydrate, and 90 mL of dimethylsulfoxide are added to a reactor and heated to 60° C. in air. Subsequently, 15 mmol of tetramethylammonium hydroxide pentahydrate is dissolved in 30 mL of ethanol and the resulting solution is added dropwise to the reactor at 3 mL/min. After stirring the mixture for 1 hour, the prepared $Zn_{0.85}Mg_{0.15}O$ nanoparticles and ethyl acetate in a volume ratio of 1:9, respectively, are separated with a centrifuge and dispersed in ethanol at a concentration of 1 wt % to provide a $Zn_{0.85}Mg_{0.15}O$ nanoparticle dispersion. When measured with an UT F30 Tecnai electron microscope, the $Zn_{0.85}Mg_{0.15}O$ nanoparticles have an average particle diameter of about 3.0 nm.

Separately, 0.06 mg of $Rb_2CO_3$ is added to 6 ml of ethanol and stirred with a magnetic bar overnight (6 hours or more), preparing a $Rb_2CO_3$ solution at a concentration of 0.01 mg/mL. Thereafter, the obtained $Zn_{0.85}Mg_{0.15}O$ nanoparticle dispersion and the $Rb_2CO_3$ solution are mixed in a volume ratio of 7:1, preparing a dispersion for an electron auxiliary layer.

Manufacture of Sample Thin Film

Preparation Example 1

On a Si substrate, a PEDOT:PSS solution (solvent: ethanol, H.C. Starks) is spin-coated and heat-treated at 150° C. for 10 minutes under an air atmosphere. The heat treated film is then heat-treated at 150° C. for another 30 minutes under a N2 atmosphere to provide a 30 nm-thick PEDOT:PSS layer. Subsequently, a solution for surface modification according to Preparation Example 3 is spin-coated onto the PEDOT:PSS layer, and heat-treated at 150° C. for 20 minutes to provide a 2 nm-thick surface modification layer on the PEDOT:PSS layer obtaining a sample thin film.

Comparative Preparation Example 1

On a Si substrate, a PEDOT:PSS solution (solvent: ethanol, H.C. Starks) is spin-coated and heat-treated at 150° ° C. for 10 minutes under an air atmosphere. The film is then heat-treated at 150° C. for another 30 minutes under a $N_2$ atmosphere to provide a 30 nm-thick PEDOT:PSS layer thin film.

Evaluation I

The sample thin films of Preparation Example 1 and Comparative Preparation Example 1 are analyzed to evaluate a HOMO energy level through ultraviolet (UV) photoelectron spectroscopy (UPS, Versaprobe, Physical Electronics). The results are shown in Table 1.

TABLE 1

| | HOMO energy level (eV) |
|---|---|
| Preparation Example 1 | 5.28 |
| Comparative Preparation Example 1 | 5.19 |

Referring to Table 1, the sample thin film of Preparation Example 1 exhibits a deeper HOMO energy level than the sample thin film of Comparative Preparation Example 1, which shows that the HOMO energy level of the sample thin film surface is effectively changed by surface-modifying the surface of a PEDOT:PSS layer with the solution for surface modification according to Preparation Example 3.

Manufacture of Sample Device

A sample of HOD (hole-only device) is manufactured to evaluate electrical characteristics of the surface modified hole auxiliary layer.

Preparation Example 2

A glass substrate on which ITO (WF: 4.8 eV, anode) is deposited is surface-treated with UV-ozone for 15 minutes. A PEDOT:PSS solution is spin-coated on the ITO (anode), heat-treated in an air atmosphere at 150° C. for 10 minutes, and then heat-treated in a N2 atmosphere at 150° C. for another 30 minutes to form a 30 nm-thick lower hole auxiliary layer. Subsequently, the solution for surface modification according to Preparation Example 3 is spin-coated on the lower hole auxiliary layer and heat-treated at 150° C. for 20 minutes to form an about 2 nm-thick surface modification region on the surface of the lower hole auxiliary layer to form a surface-modified lower hole auxiliary layer (HOMO: 5.28 eV). On the surface-modified lower hole auxiliary layer, a poly[(9,9-dioctylfluorenyl-2,7-diyl-co-(4,4'-(N-4-butylphenyl)diphenylamine] solution (TFB) (Sumitomo) is spin-coated and heat-treated at 150° C. for 30 minutes to form a 25 nm-thick upper hole auxiliary layer (HOMO: 5.6 eV, LUMO: 2.69 eV). Subsequently, on the upper hole auxiliary layer, a quantum dot dispersion according to Preparation Example 1 is spin-coated and heated at 80° C. for 30 minutes to form a 20 nm-thick light emitting layer (HOMO: 5.8 eV, LUMO: 3.1 eV, Eg: 2.7 eV). On the light emitting layer, aluminum (Al) is vacuum-deposited to form a 100 nm thick cathode (WF: 4.2 eV), to provide a sample device (HOD).

Comparative Preparation Example 2

A sample device (HOD) is manufactured in the same manner as in Preparation Example 2 except that the surface modification region is not formed on the lower hole auxiliary layer.

Evaluation II

A comparison of the electrical characteristics of the hole-only devices of Preparation Example 2 and Comparative Preparation Example 2 are evaluated with respect to current density of the sample devices (HOD).

The electrical characteristics are evaluated by using Keithley SMU2635B current source and Minolta CS-2000A spectroradiometer. The results are shown in Table 2.

TABLE 2

|  | Current density (mA/cm², @12 V) | Relative current density |
|---|---|---|
| Preparation Example 2 | 28.2 | 135 |
| Comparative Preparation Example 2 | 20.9 | 100 (Ref.) |

Referring to Table 2, the sample device of Preparation Example 2 exhibits a significant improvement in current density compared to the sample device of Comparative Preparation Example 2.

Manufacture of Quantum Dot Device I

Example 1

A glass substrate on which ITO (WF: 4.8 eV, anode) is deposited is then surface-treated with UV-ozone for 15 minutes, and then a PEDOT:PSS solution is spin-coated on the anode, heat-treatment is performed in an air atmosphere at 150° C. for 10 minutes, and then heat-treatment is performed again in a N2 atmosphere at 150° C. for another 30 minutes to form a 30 nm-thick lower hole auxiliary layer. Subsequently, the solution for surface modification according to Preparation Example 3 is spin-coated and heat-treated at 150° C. for 20 minutes to form an about 2 nm-thick surface modification region on the surface of the lower hole auxiliary layer (HOMO: 5.28 eV). On the surface-modified lower hole auxiliary layer, a poly[(9,9-dioctylfluorenyl-2,7-diyl-co-(4,4'-(N-4-butylphenyl)diphenylamine] solution (TFB) (Sumitomo) is spin-coated and heat-treated at 180° C. for 30 minutes to form a 25 nm-thick upper hole auxiliary layer (HOMO: 5.6 eV, LUMO: 2.69 eV). On the upper hole auxiliary layer, the quantum dot dispersion according to Preparation Example 1 is spin-coated and heat-treated at 80° C. for 30 minutes to form a 20 nm-thick lower light emitting layer (HOMO: 5.8 eV, LUMO: 3.1 eV, Eg: 2.7 eV). On the lower light emitting layer, the quantum dot dispersion according to Preparation Example 1 is spin-coated and heat-treated at 80° C. for 30 minutes to form a 20 nm-thick upper light emitting layer (HOMO: 5.8 eV, LUMO: 3.1 eV, Eg: 2.7 eV). Subsequently, on the upper light emitting layer, the dispersion for an electron auxiliary layer according to Preparation Example 4 is spin-coated and heat-treated at 80° C. for 30 minutes to form a 20 nm-thick electron auxiliary layer (HOMO: 7.8 eV, LUMO: 4.3 eV, Eg: 3.5 eV). Subsequently, on the electron auxiliary layer, aluminum (Al) is vacuum-deposited to be 100 nm thick to form a cathode (WF: 4.2 eV), manufacturing a quantum dot device.

Comparative Example 1

A quantum dot device is manufactured in the same manner as in Example 1 except that the surface modification region is not formed in the lower hole auxiliary layer.

Evaluation III

Electrical characteristics, light emitting characteristics, and life-span characteristics of the quantum dot devices according to Example 1 and Comparative Example 1 are evaluated. The characteristics of the quantum dot devices are measured using a current-voltage-luminance measuring instrument (Keithley 2200, Minolta CS200).

The life-span characteristics are evaluated from a luminance decrease relative to initial luminance, while injecting a current to satisfy a condition that a quantum dot device exhibits luminance of 650 nit, and T50 is evaluated by time (hour) that is taken for the luminance of the quantum dot devices to reduce to 50% of the initial luminance. The results are shown in Table 3.

TABLE 3

|  | $EQE_{max}$ (%) | $Lum_{max}$ (Cd/m²) | $T_{50}$ @650 nit (hr) | ΔV/hr | Maximum current efficiency (Cd/A$_{max}$) | Luminance (Cd/m² @5 mA) |
|---|---|---|---|---|---|---|
| Example 1 | 7.5 | 84974 | 286.9 | 0.0042 | 9.4 | 469.8 |
| Comparative Example 1 | 6.2 | 82100 | 210.1 | 0.0088 | 8.3 | 411.3 |

Referring to Table 3, the quantum dot device according to Example 1 exhibits improved electrical characteristics, light emitting characteristics, and life-span characteristics, compared with the quantum dot device according to Comparative Example 1.

Manufacture of Quantum Dot Device II

Example 2

A glass substrate on which ITO (WF: 4.8 eV, anode) is deposited is surface-treated with UV-ozone for 15 minutes, a PEDOT:PSS solution is spin-coated on the anode and heat-treated at 150° C. for 10 minutes under an air atmosphere and then, at 150° C. for 30 minutes under a N₂ atmosphere to form a 50 nm-thick lower hole auxiliary layer. Subsequently, the solution for surface modification according to Preparation Example 3 is spin-coated and heat-treated at 150° C. for 20 minutes to form an about 2 nm-thick surface modification region including the surface modification material, forming a surface modified lower hole auxiliary layer (HOMO: 5.28 eV). On the surface modified lower hole auxiliary layer, a poly[(9,9-dioctylfluorenyl-2,7-diyl-co-(4,4'-(N-4-butylphenyl)diphenylamine] solution (TFB) (Sumitomo) is spin-coated and heat-treated at 180° C. for 30 minutes to form a 25 nm-thick upper hole auxiliary layer (HOMO: 5.6 eV, LUMO: 2.69 eV). On the upper hole auxiliary layer, the quantum dot dispersion according to Preparation Example 1 is spin-coated and heat-treated at 80° C. for 30 minutes to form a 20 nm-thick lower light emitting layer (HOMO: 5.8 eV, LUMO: 3.1 eV, Eg: 2.7 eV). On the lower light emitting layer, the quantum dot dispersion according to Preparation Example 2 is spin-coated and heat-treated at 80° C. for 30 minutes to form a 20 nm-thick upper light emitting layer (HOMO: 6.1 eV, LUMO: 2.4 eV, Eg: 3.7 eV). On the upper light emitting layer, the dispersion for an electron auxiliary layer according to Preparation Example 4 is spin-coated and heat-treated at 80° C. for 30 minutes to form a 20 nm-thick electron auxiliary layer (HOMO: 7.8 eV, LUMO: 4.3 eV, Eg: 3.5 eV). On the electron auxiliary layer, aluminum (Al) is vacuum-deposited to be 100 nm thick to form a cathode (WF: 4.2 eV), manufacturing a quantum dot device.

Comparative Example 2

A quantum dot device is manufactured in the same manner as in Example 2 except that the surface modification region is not formed in the lower hole auxiliary layer.

Evaluation IV

The quantum dot devices according to Example 2 and Comparative Example 2 are evaluated with respect to electrical characteristics, light emitting characteristics, and life-span characteristics in the same manner as in Evaluation III.

The results are shown in Table 4.

TABLE 4

| | $EQE_{max}$ % | $Lum_{max}$ (Cd/m$^2$) | T50 @650 nit (hr) | ΔV/hr |
|---|---|---|---|---|
| Example 2 | 11.7 | 101881 | 362.1 | 0.0027 |
| Comp. Ex. 2 | 11.6 | 104919 | 281.9 | 0.0056 |

Referring to Table 4, the quantum dot device according to Example 2 exhibits equivalent or improved electrical/optical characteristics and improved life-span characteristics, compared with the quantum dot device according to Comparative Example 2.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A quantum dot device, comprising
an anode and a cathode spaced apart from each other,
a light emitting layer disposed between the anode and the cathode, the light emitting layer comprising quantum dots;
a first hole auxiliary layer disposed between the anode and the light emitting layer, the first hole auxiliary layer comprising poly (3,4-ethylenedioxythiophene) polystyrenesulfonate or a derivative thereof (PEDOT:PSS),
a second hole auxiliary layer disposed between the first hole auxiliary layer and the light emitting layer, the second hole auxiliary layer comprising a hole transport material different from a material of the first hole auxiliary layer,
wherein the first hole auxiliary layer has a first surface facing the anode and a second surface facing the second hole auxiliary layer, and
the second surface of the first hole auxiliary layer comprises a surface modification region comprising a surface modification material including a carboxylic acid group, a phosphonic acid group, a sulfonic acid group, or a salt thereof,
wherein in the first hole auxiliary layer a volume of the surface modification material is less than a volume of the PEDOT:PSS.

2. The quantum dot device of claim 1, wherein a HOMO energy level of the surface modification material is deeper than a HOMO energy level of the PEDOT:PSS and shallower than a HOMO energy level of the hole transport material.

3. The quantum dot device of claim 1, wherein a HOMO energy level of the surface modification material is about 5.20 eV to about 5.60 eV.

4. The quantum dot device of claim 1, wherein the surface modification material is represented by Chemical Formula 1:

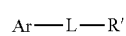

Chemical Formula 1 wherein, in Chemical Formula 1,
Ar is a substituted or unsubstituted C6 to C20 aryl group, a substituted or unsubstituted C3 to C20 heteroaryl group, or any combination thereof,
L is a single bond, a substituted or unsubstituted C1 to C20 alkylene group, a substituted or unsubstituted C6 to C20 arylene group, a substituted or unsubstituted C3 to C20 heteroarylene group, or any combination thereof, and
R' is a carboxylic acid group, a phosphonic acid group, a sulfonic acid group, or a respective salt of each thereof.

5. The quantum dot device of claim 4, wherein Ar is a substituted or unsubstituted phenyl group, a substituted or unsubstituted naphthyl group, a substituted or unsubstituted anthracenyl group, a substituted or unsubstituted fluorenyl group, a substituted or unsubstituted carbazolyl group, a substituted or unsubstituted dibenzofuranyl group, a substituted or unsubstituted dibenzothiophenyl group, or any combination thereof.

6. The quantum dot device of claim 1, wherein a thickness of the surface modification region is about 1 volume percent to about 30 volume percent of a total thickness of the first hole auxiliary layer.

7. The quantum dot device of claim 1, wherein a thickness of the surface modification region is greater than or equal to about 1 nanometer and less than about 10 nanometers.

8. The quantum dot device of claim 1, further comprising an electron auxiliary layer between the light emitting layer and the cathode,
wherein the electron auxiliary layer comprises n-type inorganic nanoparticles represented by $Zn_{1-x}Q_xO$, wherein Q is one or more metals except Zn and 0≤x<0.5, or a mixture of the n-type inorganic nanoparticles and an alkali metal, an alkali metal compound, or any combination thereof.

9. The quantum dot device of claim 1, further comprising an electron auxiliary layer between the light emitting layer and the cathode,
wherein the electron auxiliary layer comprises n-type inorganic nanoparticles represented by $Zn_{1-x}Q_xO$, wherein Q is one or more metals other than Zn and 0≤x<0.5, or a mixture of the n-type inorganic nanoparticles and an alkali metal, an alkali metal compound, or any combination thereof.

10. An electronic device comprising the quantum dot device of claim 1.

11. A quantum dot device, comprising
an anode and a cathode spaced apart from each other,
a light emitting layer disposed between the anode and the cathode, the light emitting layer comprising quantum dots, and
a first hole auxiliary layer between the anode and the light emitting layer,
wherein the first hole auxiliary layer comprises poly (3,4-ethylenedioxythiophene) polystyrenesulfonate or a derivative thereof (PEDOT:PSS) and a surface modification material having a carboxylic acid group, a phosphonic acid group, a sulfonic acid group, or a salt thereof,
wherein in the first hole auxiliary layer a volume of the surface modification material is less than a volume of the PEDOT:PSS.

12. The quantum dot device of claim 11, wherein the surface modification material is present at a surface of the first hole auxiliary layer.

13. The quantum dot device of claim 12, wherein a HOMO energy level of the surface of the first hole auxiliary layer is deeper than a HOMO energy level of the PEDOT:PSS.

14. The quantum dot device of claim 12, wherein the first hole auxiliary layer comprises
a hole auxiliary region proximate to the anode and comprising the PEDOT:PSS, and
a surface modification region proximate to the light emitting layer and comprising the surface modification material.

15. The quantum dot device of claim 14, wherein a thickness of the surface modification region is about 1 volume percent to about 30 volume percent of a total thickness of the first hole auxiliary layer.

16. The quantum dot device of claim 14, wherein a thickness of the surface modification region is greater than or equal to about 1 nanometers and less than about 10 nanometers.

17. The quantum dot device of claim 11, wherein the surface modification material is represented by Chemical Formula 1:

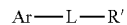

Chemical Formula 1 wherein, in Chemical Formula 1,
Ar is a substituted or unsubstituted C6 to C20 aryl group, a substituted or unsubstituted C3 to C20 heteroaryl group, or any combination thereof,
L is a single bond, a substituted or unsubstituted C1 to C20 alkylene group, a substituted or unsubstituted C6 to C20 arylene group, a substituted or unsubstituted C3 to C20 heteroarylene group, or any combination thereof, and
R' is a carboxylic acid group, a phosphonic acid group, a sulfonic acid group, or a salt thereof.

18. The quantum dot device of claim 17, wherein Ar is a substituted or unsubstituted phenyl group, a substituted or unsubstituted naphthyl group, a substituted or unsubstituted anthracenyl group, a substituted or unsubstituted fluorenyl group, a substituted or unsubstituted carbazolyl group, a substituted or unsubstituted dibenzofuranyl group, a substituted or unsubstituted dibenzothiophenyl group, or any combination thereof.

19. The quantum dot device of claim 11, further comprising a second hole auxiliary layer disposed between the first hole auxiliary layer and the light emitting layer and comprising a hole transport material different from the PEDOT:PSS,
wherein a HOMO energy level of the surface modification material is deeper than a HOMO energy level of the PEDOT:PSS and shallower than a HOMO energy level of the hole transport material, and
a HOMO energy level of the quantum dots is deeper than a HOMO energy level of the hole transport material.

20. An electronic device comprising the quantum dot device of claim 11.

* * * * *